United States Patent
Katoch

(10) Patent No.: US 9,704,599 B1
(45) Date of Patent: Jul. 11, 2017

(54) MEMORY CIRCUIT WITH ASSIST CIRCUIT TRIMMING

(71) Applicant: Taiwan Semiconductor Manufacturing Co., Ltd., Hsin-Chu (TW)

(72) Inventor: Atul Katoch, Kanata (CA)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/291,761

(22) Filed: Oct. 12, 2016

(51) Int. Cl.
*G11C 17/00* (2006.01)
*G11C 29/02* (2006.01)
*G11C 17/18* (2006.01)
*G11C 17/16* (2006.01)
*G11C 11/417* (2006.01)
*G11C 29/00* (2006.01)

(52) U.S. Cl.
CPC .......... *G11C 29/027* (2013.01); *G11C 11/417* (2013.01); *G11C 17/16* (2013.01); *G11C 17/18* (2013.01); *G11C 29/78* (2013.01)

(58) Field of Classification Search
CPC ....... G11C 29/027; G11C 29/78; G11C 17/16; G11C 17/18; G11C 11/417
See application file for complete search history.

(56) References Cited

U.S. PATENT DOCUMENTS

| 8,605,523 | B2 | 12/2013 | Tao et al. |
| 8,630,132 | B2 | 1/2014 | Cheng et al. |
| 8,760,948 | B2 | 6/2014 | Tao et al. |
| 8,908,421 | B2 | 12/2014 | Liaw |
| 8,929,160 | B2 | 1/2015 | Katoch et al. |
| 8,964,492 | B2 | 2/2015 | Hsu et al. |
| 8,982,643 | B2 | 3/2015 | Lum |
| 9,117,510 | B2 | 8/2015 | Yang et al. |
| 9,208,858 | B1 | 12/2015 | Lin et al. |
| 9,218,872 | B1 | 12/2015 | Liaw |
| 2010/0008171 | A1* | 1/2010 | Park .......... G11C 7/12 365/203 |
| 2010/0188909 | A1* | 7/2010 | Kenkare ....... G11C 11/419 365/189.16 |
| 2013/0173970 | A1* | 7/2013 | Kleveland ....... G11C 29/44 714/710 |
| 2013/0258760 | A1* | 10/2013 | Hold ......... G11C 11/412 365/154 |
| 2014/0153345 | A1 | 6/2014 | Kim et al. |
| 2014/0233330 | A1 | 8/2014 | Ko et al. |
| 2015/0146470 | A1* | 5/2015 | Katoch ......... G11C 7/22 365/72 |
| 2015/0348598 | A1 | 12/2015 | Wang et al. |
| 2015/0371702 | A1 | 12/2015 | Wu et al. |
| 2015/0380077 | A1 | 12/2015 | Wu et al. |
| 2015/0380078 | A1 | 12/2015 | Liaw |
| 2016/0247558 | A1* | 8/2016 | Jeong ......... G11C 11/413 |

* cited by examiner

*Primary Examiner* — Toan Le

(74) *Attorney, Agent, or Firm* — Duane Morris LLP

(57) ABSTRACT

A memory device includes: a memory array comprising a plurality of bits, wherein a first bit of the plurality of bits is coupled to a first assist circuit; a test engine, coupled to the memory array, and configured to examine whether each bit is functional; and an assist circuit trimming (ACT) circuit, coupled to the memory array and the test engine, and in response to the examination, configured to selectively activate the first assist circuit.

20 Claims, 4 Drawing Sheets

MEMORY CIRCUIT WITH ASSIST CIRCUIT TRIMMING

BACKGROUND

A static random access memory (SRAM) is commonly used in integrated circuits. SRAM cells have the advantageous feature of holding data without a need for refreshing. SRAM cells may include different numbers of transistors and are often accordingly referred to by the number of transistors, for example, six-transistor (6-T) SRAM, eight-transistor (8-T) SRAM, and the like. The transistors typically form a data latch for storing a bit. Additional transistors may be added to control the access to the transistors. SRAM cells are typically arranged as an array having rows and columns. Typically, each row of SRAM cells is connected to a word line, which determines whether the row of SRAM cells is selected or not. Each column of SRAM cells is connected to a bit line (or a pair of bit lines), which is used for storing a bit into, or reading a bit from, the SRAM cell.

With the increasing down-scaling of integrated circuits, the power supply voltages of the integrated circuits are reduced, along with the power supply voltages of memory circuits. Accordingly, read and write margins of the SRAM cells, which are used to indicate how reliably the bits of the SRAM cells can be read from and written into, are reduced. Due to the existence of static noise, the reduced read and write margins may cause errors in the respective read and write operations.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

As mentioned above, with the increasing down-scaling of integrated circuits, the power supply voltages of the integrated circuits are reduced, along with the power supply voltages of memory devices. Various approaches have been explored to lower $VCC_{min}$, which is the minimum power supply voltage VCC required for reliable read and write operations, to accommodate the ever-decreasing power supply voltages. For example, a variety of write assist circuits are used in a memory device to improve cell write-ability at low power supply voltages such as, for example, a word line boost assist circuit, a negative bit line assist circuit, etc.; similarly, a variety of read assist circuits are also used in a memory device to improve cell read-ability such as, for example, a word line droop assist circuit, a Vdd boost assist circuit, etc. However, the existing assist circuits used in a memory device are always active, which consumes additional active power of the memory device. Thus, existing memory devices using the assist circuits described above have not been entirely satisfactory.

The present disclosure provides various embodiments of a memory device that includes an assist circuit trimming (ACT) circuit that is configured to selectively enable/activate one or more assist circuits of the memory device when assistances of corresponding bits are needed. More specifically, in some embodiments, the memory device further includes a built-in self-test (BIST) engine that is configured to examine a function-ability of each bit of the memory device, i.e., whether each bit is capable of being read and/or written to. Based on the examined results, one or more non-functional bits may be marked with respective addresses (e.g., column×row) and the addresses of such non-functional bits are stored in a one-time programmable memory (OPM) device (e.g., an eFuse). The ACT circuit then accesses the eFuse, and based on the addresses, to selectively activate the non-functional bit's corresponding assist circuits. As such, not all of the assist circuits in the memory device are activated all the time, and moreover, only the assist circuit corresponding to the bit that needs assistance (the non-functional bit) are activated. Consequently, lower active power consumption of the memory device may be reached and one or more assist techniques are efficiently used.

Figure 1:
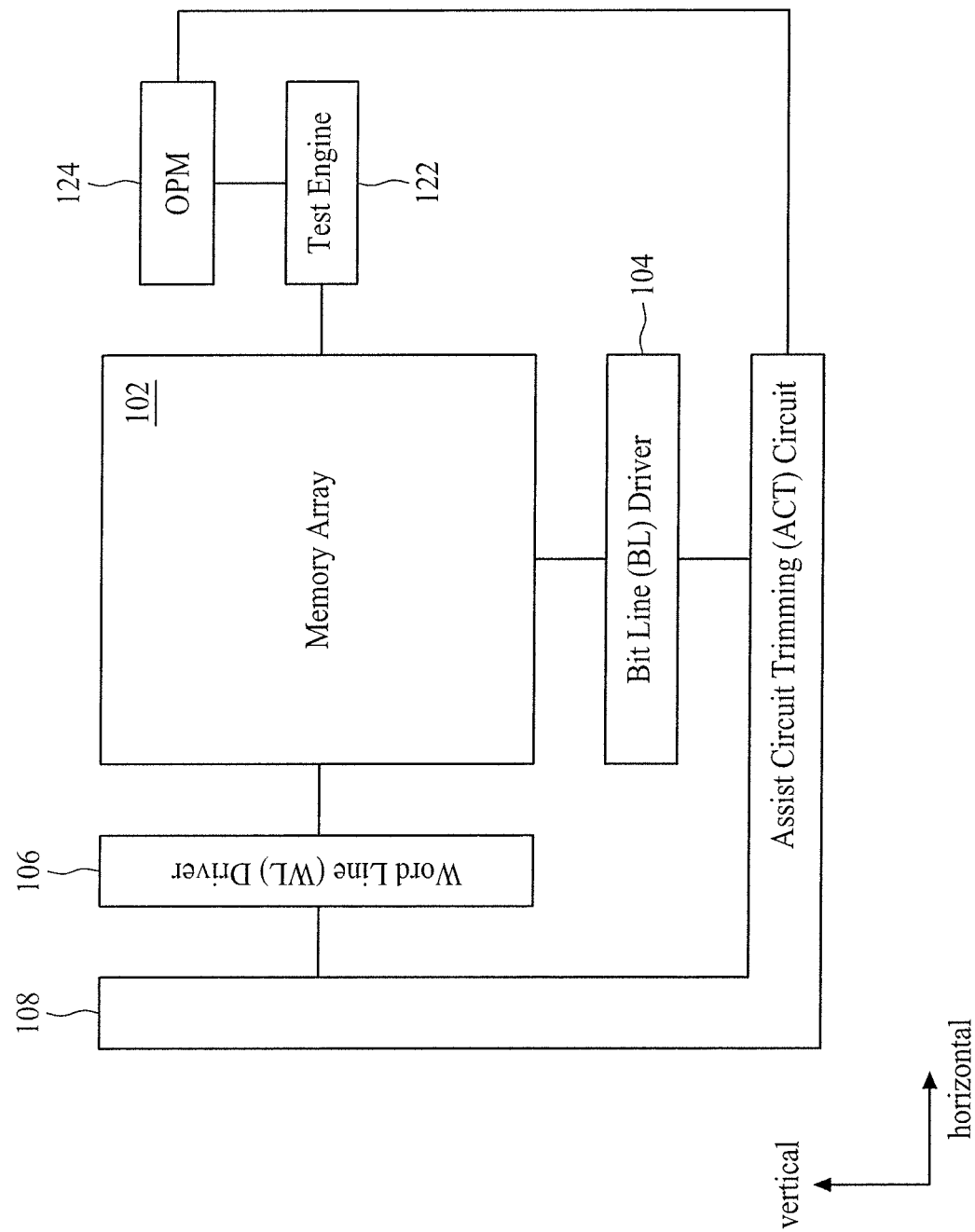
FIG. 1 illustrates an exemplary block diagram of a memory device 100, in accordance with some embodiments.

FIG. 1 illustrates an exemplary block diagram of a memory device 100 including an above-mentioned ACT circuit, in accordance with various embodiments. As shown, the memory device 100 includes a memory array 102, a bit line (BL) driver 104, a word line (WL) driver 106, an ACT circuit 108, a test engine 122, and an one-time programmable memory (OPM) device 124. It is noted that the illustrated embodiment of FIG. 1 is merely an example of a memory array and corresponding components that may be implemented in accordance with various embodiments. Additional memory arrays and one or more other components such as, for example, a pre-charge circuit, a buffer circuit, a timing circuit, etc., may be included in the memory device 100 as well while remaining within the scope of the present disclosure.

In some embodiments, the memory array 102 includes a plurality of (memory) bits. The plurality of bits are arranged in a column-row configuration, wherein each bit is arranged at an intersection of a corresponding column (disposed vertically) and a corresponding row (disposed horizontally). Each bit is configured to present or store a data bit (either a logical 1 or a logical 0) when the data bit is read from or written to the bit, respectively. Moreover, the memory array 102 includes a plurality of bit lines (BL's) (and/or bit bar lines (BBL's)) coupled to and arranged along respective columns, and a plurality of word lines (WL's) coupled to and arranged along respective rows of the memory array 102. The memory array 102 will be discussed in further detail below with respect to FIG. 2.

In some embodiments, the BL driver 104 is coupled to the memory array 102, and the plurality of bits through the above-mentioned BL's. More specifically, the BL driver 104 includes a column selector (or a BL decoder) that is configured to select one or more columns (BL's), and, in some embodiments, further includes one or more BL assist circuits that are each configured to provide either a "write assistance" or a "read assistance" through a respectively coupled BL, which will be described in further detail below with respect to FIG. 2. Similarly, the WL driver 106 is coupled to the memory array 102, and the plurality of bits through the above-mentioned WL's. More specifically, the WL driver 106 includes a row selector (or a WL decoder) that is configured to select/assert one or more rows (WL's), and, in some embodiments, further includes one or more WL assist circuits that are each configured to provide either a "write assistance" or a "read assistance" through respectively coupled WL, which will be described in further detail below with respect to FIG. 2.

In some embodiments, as shown, along the horizontal direction, a first part of the ACT circuit 108 is coupled to the memory array 102 through the BL driver 104, and, along the vertical direction, a second part of the ACT circuit 108 is coupled to the memory array 102 through the WL driver 106. As mentioned above, the ACT circuit 108 is configured to selectively enable each bit's respective (WL/BL) assist circuits based on whether the bit is functional or non-functional. Accordingly, in some embodiments, the ACT circuit 108 includes a plurality of ACT units, wherein the ACT units of the first part of the ACT circuit 108 (along the horizontal direction) are each coupled to a respective BL (and coupled bits along the BL) and a corresponding BL assist circuit (not shown) of the BL driver 104, and the ACT units of the second part of the ACT circuit 108 (along the vertical direction) are each coupled to a respective WL (and coupled bits along the WL) and a corresponding WL assist circuit (not shown) of the WL driver 106. The ACT circuit 108 (the ACT units), the BL assist circuit, and the WL assist circuit will be described in further detail below with respect to FIG. 2.

Although in the illustrated embodiment of FIG. 1, the first (horizontal) and second (vertical) parts of the ACT circuit 108 are coupled to the memory array 102 through the BL driver 104 and the WL driver 106, respectively, it is noted that the memory array 102, the BL driver 104, the WL driver 106, and the ACT circuit 108 may be laid out in a different configuration while remaining within the scope of the present disclosure. For example, either one or both of the BL driver 104 and WL driver 106 may be coupled to the memory array 102 through the first and second parts of the ACT circuit 108, respectively.

In some embodiments, the test engine 122 is coupled to the memory array 102 and each of the plurality of bits included therein. In some embodiments, the test engine 122 may include a built-in-self-test (BIST) engine. Although the test engine 122 is coupled to the memory array 102 as shown in FIG. 1, in some other embodiments, the test engine 122 may be coupled to the memory array 102 through the BL driver 104 and WL driver 106. In some embodiments, the test engine 122 is configured to use one or more processes to examine whether each bit in the memory array 102 is functional, which will be described in further detail below.

In some embodiments, the OPM device 124 is coupled to the test engine 122 and further coupled to the ACT circuit 108. In some embodiments, the OPM device 124 may include an eFuse device, which is a type of read-only memory device. Data stored/written in such an eFuse device is permanent and cannot be changed. In some embodiments, the OPM device 124 is configured to store addresses of the bits that are determined to be non-functional, and provide such address information to the coupled ACT circuit 108. As such, the ACT circuit 108 may use the address information to enable corresponding assist circuit(s), which will be described in further detail below with respect to FIG. 2.

Figure 2:
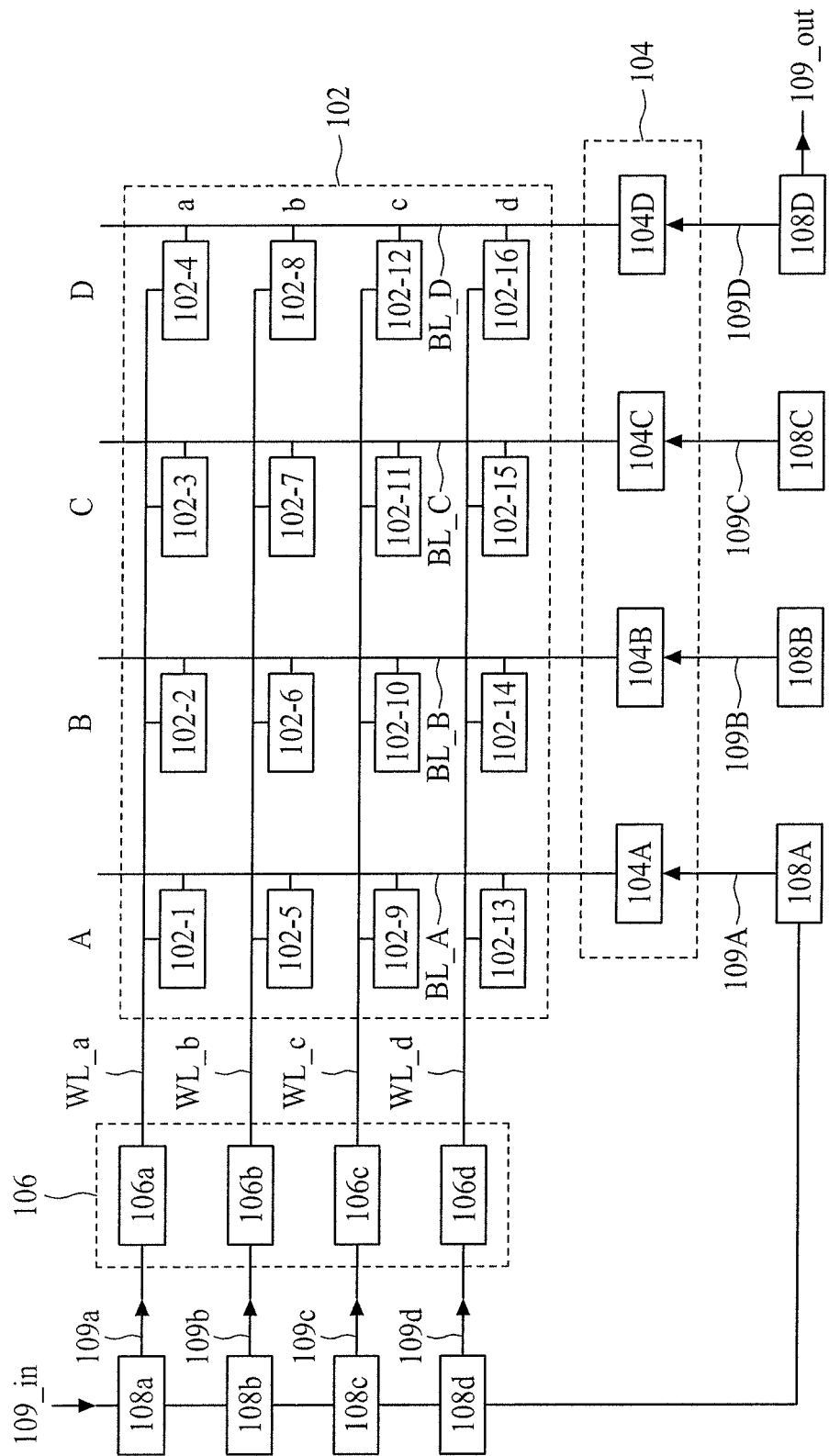
FIG. 2 illustrates an exemplary circuit diagram of the memory device 100 of FIG. 1, in accordance with some embodiments.

FIG. 2 is an exemplary block diagram to further illustrate part of the memory array 102, part of the BL driver 104, part of the WL driver 106, and part of the ACT circuit 108, in accordance with various embodiments. In some embodiments, the memory array 102 may be implemented as a static random access memory (SRAM) array. Accordingly, each bit of the plurality of bits of the memory array 102 may include an SRAM bit such as, for example, a 6-transistor (6T) SRAM bit, an 8-transistor (8T) SRAM bit, a 2-resistor 6-transistor (2T-6R) SRAM bit, etc.

As shown, 16 bits (e.g., 102-1, 102-2, 102-3, 102-4, 102-5, 102-6, 102-7, 102-8, 102-9, 102-10, 102-11, 102-12, 102-13, 102-14, 102-15, and 102-16) are shown in the memory array 102. Based on the above description, columns "A," "B," "C," and "D," and rows "a," "b," "c," and "d" are accordingly shown in the memory array 102 of FIG. 2. More specifically, along the vertical direction, the bits 102-1, 102-5, 102-9, and 106-13 are arranged along column A; the bits 102-2, 102-6, 102-10, and 106-14 are arranged along column B; the bits 102-3, 102-7, 102-11, and 102-15 are arranged along column C; and the bits 102-4, 102-8, 102-12, and 102-16 are arranged along column D. Along the horizontal direction, the bits 102-1, 102-2, 102-3, and 102-4 are arranged along row a; the bits 102-5, 102-6, 102-7, and 102-8 are arranged along row b; the bits 102-9, 102-10, 102-11, and 102-12 are arranged along row c; and the bits 102-13, 102-14, 102-15, and 102-16 are arranged along row d. Although the illustrated embodiment of FIG. 2 shows only 16 bits, any desired number of bits may be included in the embodiment of the memory array 102 while remaining within the scope of the present disclosure. As such, the number of columns and rows can be adjusted in accordance with the number of bits in the memory array 102.

As mentioned above, each column of the memory array 102 includes a BL (and/or a BBL) that is coupled to the bits arranged therein, and each row of the memory array 102 includes a WL that is coupled to the bits arranged therein. More specifically, the bits along a row are each coupled to the row's WL, and each bit is arranged in a different and separate column so as to be coupled to the respective column's BL. In some embodiment, each column may include one or more BL's/BBL's, and each row may include one or more WL's. However, for clarity, only one BL and one WL are shown along each column and row, respectively. In the illustrated embodiment of FIG. 2, the bits 102-1, 102-2, 102-3, and 102-4 along row a are each coupled to the WL "WL_a," and the bits 102-1, 102-2, 102-3, and 102-4 are arranged in columns A, B, C, and D and along BL's: "BL_A," "BL_B," "BL_C," and "BL_D," respectively. Similarly, the bits 102-5, 102-6, 102-7, and 102-8 along row b are each coupled to the WL "WL_b," and the bits 102-5, 102-6, 102-7, and 102-8 are arranged in columns A, B, C, and D and along the BL's: "BL_A," "BL_B," "BL_C," and "BL_D," respectively; the bits 102-9, 102-10, 102-11, and 102-12 along row c are each coupled to the WL "WL_c," and the bits 102-9, 102-10, 102-11, and 102-12 are arranged in columns A, B, C, and D and along the BL's: "BL_A," "BL_B," "BL_C," and "BL_D," respectively; the bits 102-13, 102-14, 102-15, and 102-16 along row d are each coupled to the WL "WL_d," and the bits 102-13, 102-14,

102-15, and 102-16 are arranged in columns A, B, C, and D and along the BL's: "BL_A," "BL_B," "BL_C," and "BL_D," respectively.

As mentioned above, the BL driver 104 includes one or more BL assist circuits (104A-104D) wherein each BL assist circuit is coupled to at least one respective BL of the memory array 102, and the WL driver 106 includes one or more WL assist circuits (106a-106d) wherein each WL assist circuit is coupled to at least one respective WL of the memory array 102.

In the illustrated embodiment of FIG. 2, the BL assist circuits 104A, 104B, 104C, and 104D of the BL driver 104 are each coupled to the BL's: BL_A, BL_B, BL_C, and BL_D, respectively, and the WL assist circuits 106a, 106b, 106c, and 106d of the WL driver 106 are each coupled to the WL's: WL_a, WL_b, WL_c, and WL_d, respectively. Although each of the BL assist circuits 104A, 104B, 104C, and 104D is coupled to a respective BL, in some embodiments, each BL assist circuit shown in FIG. 2 may be also coupled to a respective BBL. Further, although FIG. 2 only shows the assist circuits coupled to the BL's, i.e., the BL assist circuits 104A, 104B, 104C, and 104D, the BL driver may include one or more assist circuits that are each coupled to a respective BBL of the memory array 102, and such while remaining within the scope of the present disclosure.

Further, each of the WL and BL assist circuits is coupled to the bits along the respective WL and BL, respectively, and each WL/BL assist circuit is coupled with a respective ACT unit that allows the coupled WL/BL assist circuit to be selectively activated. As shown, along the vertical direction, the WL assist circuit 106a is coupled to the bits along WL_a (e.g., bits 102-1, 102-2, 102-3, 102-4, etc.) and with ACT unit 108a; the WL assist circuit 106b is coupled to the bits along WL_b (e.g., bits 102-5, 102-6, 102-7, 102-8, etc.) and with ACT unit 108b; the WL assist circuit 106c is coupled to the bits along WL_c (e.g., bits 102-9, 102-10, 102-11, 102-12, etc.) and with ACT unit 108c; the WL assist circuit 106d is coupled to the bits along WL_d (e.g., bits 102-13, 102-14, 102-15, 102-16, etc.) and with ACT unit 108d. Along the horizontal direction, the BL assist circuit 104A is coupled to the bits along BL_A and with ACT unit 108A; the BL assist circuit 104B is coupled to the bits along BL_B and with ACT unit 108B; the BL assist circuit 104C is coupled to the bits along BL_C and with ACT unit 108C; the BL assist circuit 104D is coupled to the bits along BL_D and with ACT unit 108D.

In some embodiments, the ACT units of the ACT circuit 108 are coupled to one another serially as a chain. Further, such an (ACT) chain may be configured to receive a common clock signal and one or more data signal. In response to the common clock signal and data signal(s), each of the ACT units may provide an enablement/activation signal to activate a corresponding WL or BL assist circuit, which will be discussed in further detail below with respect to the operation of the ACT circuit 108.

As described above, each of the (WL/BL) assist circuits is configured to provide either a read assistance or a write assistance to one or more coupled bits (of the memory array 102). In accordance with various embodiments of the present disclosure, each of the BL assist circuits (e.g., 104A, 104B, 104C, 104D, etc.) may be configured to provide a negative voltage on a coupled BL, typically referred to as a "negative BL" technique (for a write assistance), to reduce electric charge on a coupled BL (for a read assistance), to increase a differential voltage between coupled BL and BBL (for a write assistance), or a combination thereof. Each of the WL assist circuits (e.g., 106a, 106b, 106c, 106d, etc.) may be configured to provide a reduced voltage on a coupled WL, typically referred to as a "WL droop" technique (for a read assistance), to provide an increased voltage on a coupled WL, typically referred to as a "WL boost" technique (for a write assistance), or a combination thereof.

In an example, when the BL assist circuit 104A is designed to provide a "negative BL" functionality, the BL assist circuit 104A may provide a negative voltage and apply such a negative voltage to the BL_A during one or more of the bits 102-1, 102-5, 102-9, and 102-13 being written (with a logical 0). In another example, when the WL assist circuit 106c is designed to provide a "WL droop" functionality, the WL assist circuit 106c may apply a reduced voltage on the WL_c during one or more of the bits 102-9, 102-10, 102-11, and 102-12 being read. Yet in another example, when the WL assist circuit 106d is designed to provide a "WL boost" functionality, the WL assist circuit 106d may apply an increased voltage on the WL_d during one or more of the bits 102-13, 102-14, 102-15, and 102-16 being written.

In some embodiments, each of the assist circuits (e.g., 104A, 104B, 104C, 104D, 106a, 106b, 106c, 106d, etc.) is configured to apply its respective functionality to one or more coupled bits so as to provide an intended assistance. As such, each bit may be coupled to (assisted by) one or more assist circuits. In the embodiment in which a bit is assisted by only an assist circuit, such an assist circuit may be disposed either in the BL driver 104 or the WL driver 106. In the embodiment in which a bit is assisted by two (or more) assist circuits, each of the assist circuits may be disposed in the BL driver 104 and WL driver 106, respectively, and the assist circuits may provide complementary assistance, i.e., one is for the read assistance and the other is for the write assistance.

Although the above-described embodiments implement the BL and WL assist circuits (104A, 104B, 104C, 104D, 106a, 106b, 106c, 106d) as part of the BL driver 104 and the WL driver 106, respectively, in alternative embodiments, the BL assist circuits may be implemented as a separate and different block from the BL driver 104. As such, the BL assist circuits may be coupled to the memory array 102 through the above-described BL decoder (not shown) of the BL driver 104. Similarly, the WL assist circuits may be implemented as a separate and different block from the WL driver 106. As such, the WL assist circuits may be coupled to the memory array 102 through the above-described WL decoder (not shown) of the WL driver 106.

In some embodiments, when only the BL assist circuits or the WL assist circuits are included in the memory device 100, the respectively coupled ACT units may not be included. For example, when the memory device 100 includes only the BL assist circuits (e.g., 104A, 104B, 104C, 104D, etc.), the WL driver 106 (e.g., the WL selector) may be directly coupled to the memory array 102 without the ACT units (e.g., 108a, 108b, 108c, 108d, etc.) being coupled therewith. As such, the ACT circuit (chain) may only include the ACT units along row, e.g., 108A, 108B, 108C, 108D, etc.

As mentioned above, in the conventional memory device that uses the assistance techniques, the assist circuits generally stay active all the time, which causes the memory device to consume extra active power. In other words, each bit of such a conventional memory device receives one or more assistances even though some of the bits are not necessary to receive any assistance (i.e., the bits are functional to be read and/or written even without any assistance). In accordance with various embodiments of the present disclosure, the test engine 122 examines each bit's readability and/or write-ability and then stores the results (e.g., the respective address of non-functional bits) in the OPM device 124, and the ACT circuit 108 accesses the OPM device 124 to retrieve the results so as to recognize where the bits with non-functional read-ability and/or write-ability are and accordingly activates corresponding assist circuit(s), which will be described in further detail below. The following discussion of the operation of the memory device 100 will be provided in conjunction with FIGS. 1 and 2.

In some embodiments, the ACT circuit 108 may deactivate all, or at least part of, the assist circuits (e.g., 104A, 104B, 104C, 104D, 106a, 106b, 106c, 106d, etc.) of the memory device 100. Then the test engine 122 (implemented as a BIST engine in the present disclosure) accesses the memory array 102 to examine each of the bits of the memory array 102 by any of a variety of self-test techniques. In some embodiments, the test engine 122 may sequentially access each bit (e.g., writing a bit data to the bit, read a bit data from the bit, etc.) and use the below-described process to examine each bit.

For example, the test engine 122 causes the bit 102-1 to be biased at a nominal supplied voltage (e.g., Vdd, which is a supplied voltage of the memory device 100), causes a corresponding component(s)/circuit(s) (e.g., BLA_, Wl_a, etc.) to write a data bit to the bit 102-1, and checks whether the write is successful. If the write is not successful, the test engine 122 may accordingly store the address of the bit 102-1 (e.g., column A×row a) in the OPM device 124, and recognize the bit 102-1 is non-functional to be written (i.e., non-functional with write-ability). If the write (when the bit is biased at Vdd) is successful, the test engine 122 may iteratively cause the bit 102-1 to be biased at a lower voltage with a voltage decrement (e.g., 10 mV) and perform similar write operations described above to check whether the bit 102-1 can be written until the bit 102-1 is biased at Vccmin (i.e., the minimum supplied voltage for the bits of the memory array 102 while the bits can still be written and/or read). If the bit 102-1 can still be written while being biased at Vccmin, the test engine 122 may recognize the bit 102-1 as a functional bit that needs no any assistance. However, if the bit 102-1 fails to be written during the iteration, the test engine 122 may recognize the bit 102-1 as a non-functional bit and stores the corresponding address for the later use. Although the above-provided example is directed to checking the "write-ability" of the bit, the test engine 122 may also perform a read-ability check on each bit, recognize each bit's read-ability, store each bit's respective address (with the recognized read-ability and/or write-ability) to the OPM device 124. As such, in some embodiments, each bit's read-ability and/or write-ability with the respective address in the memory array 102 are stored in the OPM device 124.

Figure 3:
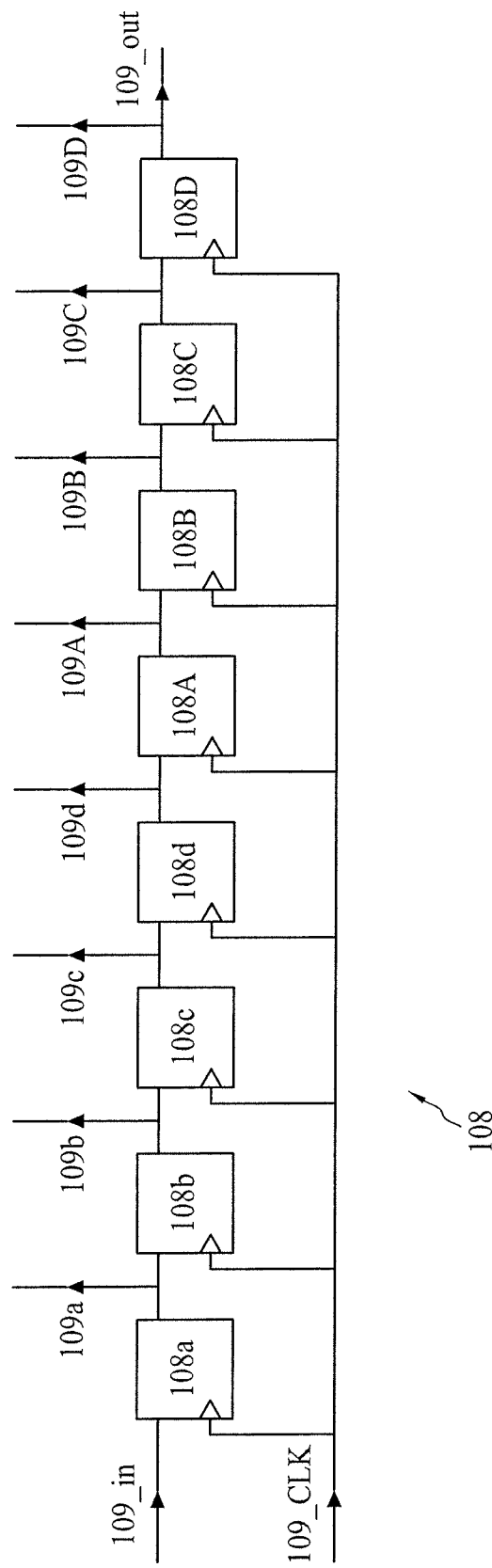
FIG. 3 illustrates an exemplary circuit diagram of an assist circuit trimming (ACT) circuit of the memory device of FIG. 1, in accordance with some embodiments.

In some embodiments, such information of the bits' read-/write-ability with respective addresses may be virtually stored as a "map" in the OPM device 124. After the test engine 122 finishes with the examination of all the bits across the memory array 102, the ACT circuit 108 then accesses the OPM device 124 to retrieve the map so as to activate corresponding assist circuit(s). Depending on the recognized read-ability and/or write-ability of each bit, the ACT circuit 108 may use the bit's corresponding ACT unit(s) to activate the bit's assist circuit(s) by providing activation signal(s) (e.g., 109a, 109b, 109c, 109d, 109A, 109B, 109C, 109D, etc.), as shown in FIG. 3. More specifically, the activation signals that are each configured to activate a respective assist circuit may be asserted sequentially. That is, during a first period of time, the ACT circuit 108 may determine to activate a first set of assist circuits, and during a second period of time the ACT circuit 108 may determine to activate a second set of assist circuits. Such sequences may be determined based on the a data signal and a clock signal received by the ACT units, which will be discussed in further detail below. In some embodiments, each of the ACT units (108a, 108b, 108c 108d, 108A, 108B, 108C, and 108D) is implemented as an edge-triggered flip flop (e.g., an SR flip flop, a JK flip flop, a D flip flop), and the flip flops are serially coupled to each other as a chain, as illustrated in FIG. 3.

In the illustrated embodiment of FIG. 3, each of the ACT units includes a D flip flop that is synchronized by a common clock signal "109_clk." Further, a first D flip flop (i.e., the ACT unit 108a) of the chain is configured to receive a data signal "109_in," and provide an output to its next-stage D flip flop (i.e., the ACT unit 108b). In some embodiments, such output may also serve as the activation signal 109a to the coupled assist circuit 106a (FIG. 2). Accordingly, the ACT unit 108b is configured to receive the activation signal 109a as its data signal (input) and output the activation signal 109b. Similarly, the ACT unit 108c is configured to receive the activation signal 109b as its data signal (input) and output the activation signal 109c; the ACT unit 108d is configured to receive the activation signal 109c as its data signal (input) and output the activation signal 109d; the ACT unit 108A is configured to receive the activation signal 109d as its data signal (input) and output the activation signal 109A; the ACT unit 108B is configured to receive the activation signal 109A as its data signal (input) and output the activation signal 109B; the ACT unit 108C is configured to receive the activation signal 109B as its data signal (input) and output the activation signal 109C; the ACT unit 108D is configured to receive the activation signal 109C as its data signal (input) and output the activation signal 109D. In some embodiments, the activation signal 109D may serve as an output signal of the chain, "109_out."

Figure 4:
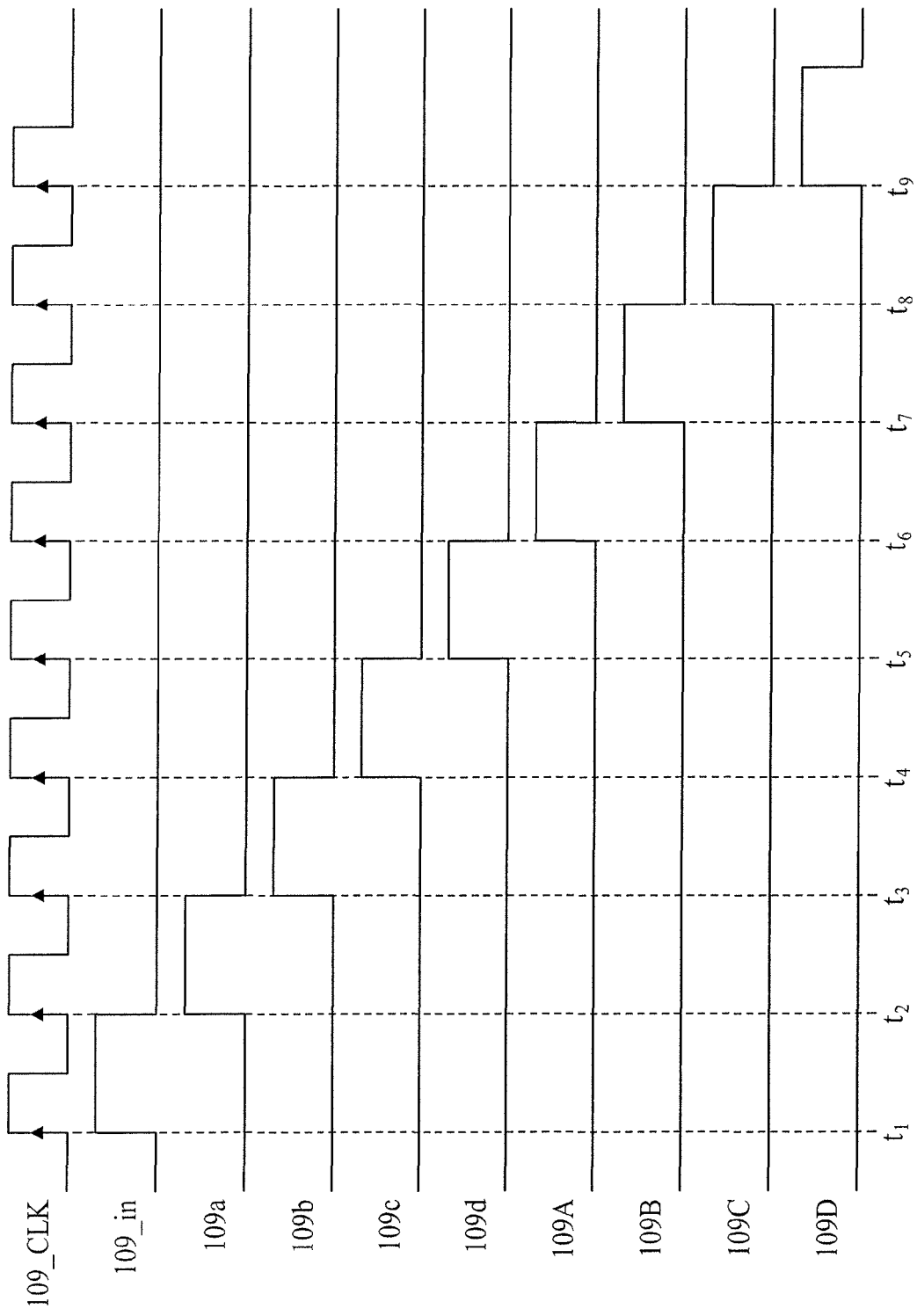
FIG. 4 illustrates exemplary waveforms to operate the ACT circuit of FIG. 3, in accordance with some embodiments.

Generally, a D flip flop follows its input but cannot make a transition (as requested by the input) unless a triggered edge (e.g., a rising edge and/or a falling edge) is received. An exemplary operation of the ACT circuit (chain) 108 is illustrated in FIG. 4, in accordance with various embodiments. Waveforms of the (common) clock signal 109_clk, the data signal 109_in, the plural activation (output) signals 109a, 109b, 109c, 109d, 109A, 109B, 109C, and 109D are illustrated, respectively. Each of the waveforms in FIG. 4 varies over time between a high logical state (hereinafter "HIGH") and a low logical state (hereinafter "LOW"). As shown, the clock signal 109_clk includes rising edges at time t1, t2, t3, t4, t5, t6, t7, t8, and t9, respectively. Based on the above-described principle of the D flip flop and the given data signal 109_in, each of the activation signals 109a, 109b, 109c, 109d, 109A, 109B, 109C, and 109D may vary over time as illustrated.

In some embodiments, when an activation signal is at HIGH, the assist circuit receiving the activation signal may be activated. Otherwise, in some embodiments, the assist circuit may remain deactivated. For example, referring to FIGS. 2 and 4 concurrently, during t1 to t2, the ACT circuit 108 determines that no bits need assistance; during t2 to t3, the ACT circuit 108 determines that the bit 102-1 needs (either read or write) assistance, which can be provided by the assist circuit 106a; during t3 to t4, the ACT circuit 108 determines that the bit 102-5 needs (either read or write) assistance, which can be provided by the assist circuit 106b; during t4 to t5, the ACT circuit 108 determines that the bit 102-9 needs (either read or write) assistance, which can be provided by the assist circuit 106c; during t5 to t6, the ACT circuit 108 determines that the bit 102-13 needs (either read or write) assistance, which can be provided by the assist circuit 106d; during t6 to t7, the ACT circuit 108 determines that the bit 102-13 needs (either read or write) assistance, which can be provided by the assist circuit 104A; during t7 to t8, the ACT circuit 108 determines that the bit 102-14 needs (either read or write) assistance, which can be provided by the assist circuit 104B; during t8 to t9, the ACT circuit 108 determines that the bit 102-15 needs (either read or write) assistance, which can be provided by the assist circuit 104C. In some embodiments, such information may be retrieved from the OPM device 124.

Accordingly, the ACT circuit 108 provides the data signal 109_in to the chain of ACT units so as to cause each ACT unit to assert an activation signal at a suitable timing.

In an embodiment, a memory device is disclosed. The memory device includes: a memory array comprising a plurality of bits, wherein a first bit of the plurality of bits is coupled to a first assist circuit; a test engine, coupled to the memory array, and configured to examine whether each bit is functional; and an assist circuit trimming (ACT) circuit, coupled to the memory array and the test engine, and in response to the examination, configured to selectively activate the first assist circuit.

In another embodiment, a memory device includes: a memory array comprising a plurality of bits, wherein first and second bits of the plurality of bits are coupled to first and second assist circuits, respectively; a test engine, coupled to the memory array, and configured to examine whether each bit is functional; and an assist circuit trimming (ACT) circuit, coupled to the memory array and the test engine, and is configured to deactivate the first and second assist circuits, and, in response to the examination, activate the first assist circuit.

Yet in another embodiment, a memory device includes a memory array comprising a plurality of bits, wherein a first bit of the plurality of bits is coupled to first and second assist circuits; a test engine, coupled to the memory array, and configured to examine whether each bit is functional; and an assist circuit trimming (ACT) circuit, coupled to the memory array and the test engine, and in response to the examination, configured to selectively activate the first and second assist circuits for the bit.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory array comprising a plurality of bits, wherein a first bit of the plurality of bits is coupled to a first assist circuit;
    a test engine, coupled to the memory array, and configured to examine whether each bit is functional; and
    an assist circuit trimming (ACT) circuit, coupled to the memory array and the test engine, and in response to the examination, configured to selectively activate the first assist circuit.

2. The memory device of claim 1, wherein the first bit is coupled with a second assist circuit.

3. The memory device of claim 2, wherein the ACT circuit, in response to the examination, is configured to selectively activate the second assist circuit.

4. The memory device of claim 3, wherein the first assist circuit is disposed along a column of the memory array, and the second assist circuit is disposed along a row of the memory array.

5. The memory device of claim 1, further comprising:
    a one-time programmable memory device, coupled to the test engine and the ACT circuit, and configured to store an address of a bit that is not functional.

6. The memory device of claim 5, wherein the one-time programmable memory device includes an eFuse device.

7. The memory device of claim 1, wherein the ACT circuit further comprises:
    a first flip flop, coupled to the first bit and the first assist circuit, and configured to provide an activation signal to activate the first assist circuit if the first bit is determined to be non-functional.

8. The memory device of claim 7, wherein the first flip flop comprises a D flip flop.

9. A memory device, comprising:
    a memory array comprising a plurality of bits, wherein first and second bits of the plurality of bits are coupled to first and second assist circuits, respectively;
    a test engine, coupled to the memory array, and configured to examine whether each bit is functional; and
    an assist circuit trimming (ACT) circuit, coupled to the memory array and the test engine, and is configured to deactivate the first and second assist circuits, and, in response to the examination, activate the first assist circuit.

10. The memory device of claim 9, wherein the first assist circuit is disposed arranged along either a column of the memory array or a row of the memory array.

11. The memory device of claim 9, wherein the second assist circuit is disposed arranged along either a column of the memory array or a row of the memory array.

12. The memory device of claim 9, wherein based on the examination, the first and second bits are non-functional and functional, respectively.

13. The memory device of claim 9, further comprising:
    a one-time programmable memory device, coupled to the test engine and the ACT circuit, and is configured to store an address of the first bit.

14. The memory device of claim 9, wherein the ACT circuit further comprises:
    a first flip flop, coupled to the first bit and the first assist circuit, and configured to provide a first activation signal at a logical high state to activate the first assist circuit if the first bit is determined to be non-functional; and
    a second flip flop, coupled between the second bit and the second assist circuit, and configured to provide a second activation signal at a logical low state to remain deactivation of the second assist circuit if the first bit is determined to be functional.

15. The memory device of claim 14, wherein the first and second flip flops each includes a D flip flop.

16. A memory device, comprising:
    a memory array comprising a plurality of bits, wherein a first bit of the plurality of bits is coupled to first and second assist circuits;
    a test engine, coupled to the memory array, and configured to examine whether each bit is functional; and an assist circuit trimming (ACT) circuit, coupled to the memory array and the test engine, and in response to the examination, configured to selectively activate the first and second assist circuits for the bit.

17. The memory device of claim 16, wherein the ACT circuit further comprises:
a first flip flop, coupled to the bit and the first assist circuit, and configured to provide a first activation signal at a first logical state to activate the first assist circuit if the first bit is determined to be non-functional; and
a second flip flop, coupled between the bit and the second assist circuit, and configured to provide a second activation signal at the first logical state to activate the second assist circuit if the first bit is determined to be non-functional.

18. The memory device of claim 17, wherein the first and second flip flops each includes a D flip flop.

19. The memory device of claim 17, further comprising:
a one-time programmable memory device, coupled to the test engine and the ACT circuit, and is configured to store an address of the bit.

20. The memory device of claim 19, wherein the one-time programmable memory device includes an eFuse device.

\* \* \* \* \*